United States Patent [19]

Babakanian et al.

[11] Patent Number: 5,166,547
[45] Date of Patent: Nov. 24, 1992

[54] PROGRAMMABLE DCVS LOGIC CIRCUITS

[75] Inventors: Jacquelin Babakanian; James W. Davis; Mark S. Garvin; Kim P. Liew, all of Palm Beach, Fla.; Yoav Medan, Haifa, Italy; Nandor G. Thoma, Palm Beach, Fla.

[73] Assignee: International Business Machines Corporation, Armonk, N.Y.

[21] Appl. No.: 711,487

[22] Filed: Jun. 5, 1991

[51] Int. Cl.$^5$ .................. H01L 25/00; H03K 19/094
[52] U.S. Cl. .............................. 307/303.2; 307/465.1; 307/469; 307/451
[58] Field of Search .................. 307/443, 303.2, 303.1, 307/465, 465.1, 466–429, 451, 455

[56] References Cited

U.S. PATENT DOCUMENTS

| | | | |
|---|---|---|---|
| 4,607,339 | 8/1986 | Davis | 364/491 |
| 4,608,649 | 8/1986 | Davis et al. | 364/491 |
| 4,615,010 | 9/1986 | Davis et al. | 364/491 |
| 4,633,104 | 12/1986 | Mallinson | 307/467 |
| 4,686,392 | 8/1987 | Lo | 307/455 |
| 4,760,289 | 7/1988 | Eichelberger et al. | 307/455 |
| 4,937,475 | 6/1990 | Rhodes et al. | 307/465.1 |

OTHER PUBLICATIONS

R. T. Smith et al, Laser Programmable Redundancy and Yield Improvement in a 64K DRAM, Oct. 1981, IEEE Journal of Solid-State Circuits, vol. SC-16, No. 5, pp. 506–513.

T. Mano et al, A Redundancy Circuit for a Fault-Tolerant 256K MOS RAM, Aug. 1982, IEEE Journal of Solid-State Circuits, vol. SC-A7, pp. 726–731.

L. R. Metzger, A 16K CMOS PROM with Polysilicon Fusible Links, Oct. 1983, IEEE Journal of Solid-State Circuits, vol. SC-18, No. 5, pp. 562–567.

L. G. Heller et al, Cascode Voltage Switch Logic: A Differential CMOS Logic Family, Feb. 1984, IEEE International Solid-State Circuits Conference, Session 1, pp. 16, 17.

L. C. M. G. Pfennings et al, Differential Split-Level CMOS Logic for Subnanosecond Speeds, Oct. 1985, IEEE Journal of Solid-State Circuits, vol. SC-20, No. 5, pp. 1050–1055.

T. A. Grotjohn et al, Sample-Set Differential Logic (SSDL) for Complex High-Speed VLSI, Apr. 1986, IEEE Journal of Solid-State Circuits, vol. SC-21, No. 2, pp. 367–369.

(List continued on next page.)

Primary Examiner—David Hudspeth
Assistant Examiner—Andrew Sanders
Attorney, Agent, or Firm—Robert Lieber; John C. Smith

[57] ABSTRACT

A basic tree construction, from which differential cascode voltage switch (DCVS) circuits having variable logic personality can be formed, contains n (>2) rows of differentially associated semiconductor device pairs spanned by n pairs of complementary input conductor leads, and a load circuit coupled to drain terminals of devices in the nth row. The nth row contains 2 device pairs and each other row contains $2^{i-1}$ device pairs (i=1, 2, ..., n−1). Connections between source and drain terminals of devices in successive rows are predefined from the 1st to the n−1st row and variably definable between the n−1st and nth rows. Connections between input conductors and device gate terminals are predefined in each row other than the nth row, and variably definable in the nth row. Upon selectively defining a set of variable connections relative to the n−1st and nth rows the logic personality of the tree is selected to conform to any one of all possible functions of n variables. Logic function personalization is established in one embodiment by altering materials at discrete points in a space between n−1st and nth rows. In another embodiment, personalization is established by altering signals stored by latch devices in the space between the n−1st and nth rows which control gating device adjacently positioned to form conductive connections corresponding to those formed by altering materials in the first embodiment.

16 Claims, 9 Drawing Sheets

OTHER PUBLICATIONS

J. A. Pretorius et al, Latched Domino CMOS Logic, Aug. 1986, *IEEE Journal of Solid-State Circuits*, vol. SC-21, No. 4, pp. 514–522.

K. M. Chu et al, Dec. 1986, Design Procedures for Differential Cascode Voltage Switch Circuits, *IEEE Journal of Solid-State Circuits*, vol. SC-21, No. 6, pp. 1082–1087.

J. H. Pasternak et al, Apr. 1987, CMOS Differential Pass-Transistor Logic Design, *IEEE Journal of Solid-State Circuits*, vol. SC-22, No. 2, pp. 216–222.

S. M. Kang, Domino-CMOS Barrel Switch for 32-Bit VLSI Processors, May 1987, *IEEE Circuits and Devices Magazine*, pp. 3–8.

P. Sheridan et al, An Expression for the Propagation Delay of a Differential Split-Level (DSL) CMOS Logic, Jun. 1987, *IEEE Journal of Solid-State Circuits*, vol. SC-22, No. 3, pp. 457–459.

K. M. Chu et al, A Comparison of CMOS Circuit Techniques: Differential Cascode Voltage Switch Logic Versus Conventional Logic, Aug., 1987, *IEEE Journal of Solid-State Circuits*, vol. SC-22, No. 4, pp. 528–532.

S. Lu, Implementation of Iterative Networks with CMOS Differential Logic, Aug. 1988, *IEEE Journal of Solid-State Circuits*, vol. 23, No. 4, pp. 1013–1017.

M. McClure et al, The Multiple Flavors of PIC Devices, 1990, High Performance Systems Magazine, Programmable Logic Design Guide Issue, pp. 6–8, 12, 13.

P. Alfke, New Device Extends FPGA Capabilities, 1990, High Performance Systems Magazine, Programmable Logic Design Guide Issue, pp. 21, 22, 24.

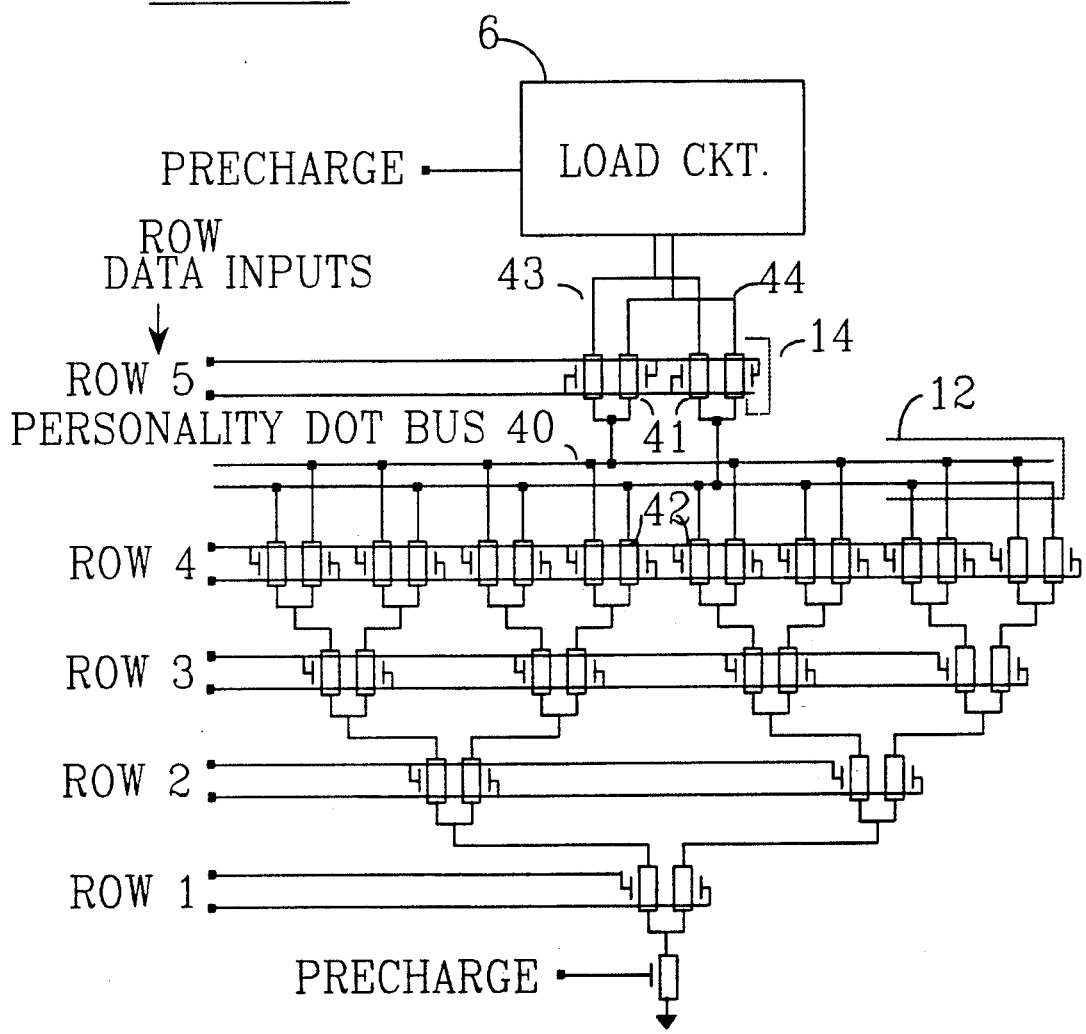

PROGRAMMABLE DCVS LOGIC CIRCUITS

FIELD OF THE INVENTION

This invention relates to techniques for developing complex logic circuits based on differential cascode voltage switch (DCVS) technologies, and particularly to device topologies and associated design and fabrication processes which facilitate fast and cost effective implementation of DCVS logic circuits.

BACKGROUND OF THE INVENTION

U.S. Pat. No. 4,608,649 (the '649 patent), granted Aug. 26, 1986 to J. W. Davis et al, describes a technique for constructing DCVS circuits in which clusters of active differentially associated pairs of devices (e.g. CMOS transistor gates) and circuits formed by interconnecting the devices are constructed in essentially a single process. Each cluster is customized to contain only the devices required to construct a particular circuit for performing an operation representing a particular logical function.

The design of such circuits tends to be rather complex, and difficult to modify once finalized. Thus, circuits produced by such processes tend to have long and costly development cycles and rather high manufacturing costs.

The present invention seeks to provide a device topology and process for constructing DCVS circuits of comparable density but in less time and at less cost than would be required using the technique of the above '649 patent.

OBJECTS OF THE INVENTION

An object of the invention is to provide a unique topological basis for designing and fabricating DCVS logic circuits, which is simpler, less costly and susceptible of quicker development turn-around time than comparable design techniques based on the '649 patent, and which is susceptible of yielding circuitry that operates efficiently and makes efficient use of space in semiconductor chip structures.

A more specific object is to provide, as stock components which form a convenient and efficient packaging base for constructing complex DCVS circuits, semiconductor chip structures containing clusters of differentially associated active devices arranged in unique tree formations.

A related object is that each tree cluster contain a predetermined number of active devices arranged in a predetermined configuration, with a connection region between certain of the devices so configured that by making circuit connections at selected points in the connection region the devices in the tree are formed into a DCVS logic circuit whose output represents any one of all possible functions of n ($>$1) binary variables.

A related object is that such trees be constructed to occupy areas of predetermined size and shape on a semiconductor substrate, and provide a basis for constructing varied-function DCVS logic circuits which make efficient use of chip space and have minimal spurious coupling between discrete circuit paths within any tree.

Another object is to provide, as basic components from which to form varied-function DCVS logic circuits, tree clusters of differentially associated pairs of active devices, wherein the device pairs are arranged in ordered rows and wherein connections required to form a DCVS logic circuit are in part predefined and in part subject to selective definition relative to a connection region of predetermined form located between two of the rows.

Another object is to provide, as stockable semiconductor components, chips containing multiple tree clusters of active device pairs, wherein each tree contains a predetermined number of differentially associated device pairs arranged in n ordered rows (n$>$1), with a predetermined number of device pairs in each row, and wherein devices in different rows of each tree are formed with different widths in order to reduce the aggregate resistance of cascode coupled circuits formed through such devices, and thereby reduce charging and discharging delays in such circuits and provide other benefits, both electrical and topological, in respect to the layout of tree components. A related object is to so configure devices and signal conductors in each tree that by simply cutting signal conductors at selected row positions, a selected number of devices in the trees are isolated so as to render circuits extending through those devices non-conductive; whereby circuits which do not significantly affect the tree output are blocked from conducting. Thus, for example, when an n-row tree in accordance with the present invention is formed into a DCVS circuit whose operation represents a logical function of fewer than n binary variables the individual circuit paths through the tree which represent non-relevant or "don't care" logical states relative to the logical output of the tree are effectively disabled without having to remove or modify any of the devices in the tree (i.e. without having to redesign the topological circuit layout and incur development costs associated therewith).

Another object is to provide basic chip stock components, with n-row tree structures as just characterized, which are topologically configured both for simplifying their manufacture as stock components and for simplifying the processing required to establish a final logical function personality by reducing the latter to a simple process of forming selected circuit connections without having to revise the number of devices populating the chip and their topological form and layout on the chip.

Another object is to provide, as basic intermediate components in the design and construction of DCVS logic circuits, chip components containing one or more n-row tree clusters wherein each row of any tree contains a predetermined number of differentially associated pairs of devices and a pair of input conductors traversing the respective devices; and wherein the rows are so configured that by variably defining conductive connections solely within a connection region between two rows, a DCVS circuit is defined whose logical operation represents any one of all possible logical functions of n or fewer variables.

Another object is to base design of DCVS logic circuits on unique tree formations as characterized above, wherein each tree efficiently occupies a small rectangular area and wherein widths of devices in certain rows are inversely proportioned to the number of devices in the respective rows, whereby charging and discharging delay characteristics of circuits in each tree are effectively minimized and the rectangular area allocated to the tree is optimally utilized for that purpose.

A related object is to so position devices and input conductors in each row that it is simple to form discontinuities in the input conductors at selected row positions, with the effect that current flow through superfluous devices can be eliminated when the finalized logic function to be created in a given tree is a function of less than n variables.

Another object is to base design of DCVS circuits on tree formations, with devices arranged in rows as just characterized, wherein all variably definable connections establishing a final logical circuit function (personality) in a tree are concentrated into a connection region of predetermined form and dimensions located in a predetermined space between two of the rows in each tree.

Another object is to so configure devices in each tree that the number of connection points required to be provided in the connection region mentioned above is small in relation to the total number of connections between devices and conductors in the finalized tree circuit, whereby each tree can be processed from its initial/stock form, into a DCVS logic circuit representing a selected function of n or fewer variables, faster and at less cost than a functionally equivalent circuit constructed using techniques of the above '649 patent.

Another object is to so configure devices in each tree that the space between devices ("porosity") in at least one of the rows bordering the connection region effectively allows formation of circuit connections with minimized undesired or spurious electrical properties relative to devices in the respective bordering row or rows.

Another object is to provide a method for manufacturing complex DCVS integrated circuits, based upon constructing connections within and between tree formations of the type characterized above, whereby such circuits may be developed and manufactured faster and at less cost than would be required to develop and manufacture functionally comparable circuits using techniques of the '649 patent.

Another object is to provide a basic device tree topology for DCVS circuit formation, as characterized above, in which the connection region of each tree is constructed to be particularly suited for programmed formation of connections in that region, whereby connections establishing logical function personalities of all such trees may be made by programmed modification of conductive materials located in that region.

Another object is to provide a basic device tree topology of unique form, and an associated method of forming connections therein, such that logic function personalities established in individual trees can be electrically altered.

SUMMARY OF THE INVENTION

These and other objects are realized by defining a unique tree topology in which pairs of active devices are produced in a formation of n rows (n greater than 1), and in which the number of device pairs and their interconnections are preconfigured, so that, by a simple process of selecting variable connections relative to devices in at most two rows, each tree can be formed into a circuit whose output represents any one of all possible logical functions of n or fewer binary variables.

Each tree cluster formed in accordance with the presently contemplated topology occupies a predetermined or predefinable area on a substrate of an integrated semiconductor slice or chip. The number of devices, in each row and in the tree as a whole, is so pre-arranged that by selectively defining connections relative to two of the rows the tree can be "personalized" into a DCVS logic circuit whose operation represents any selected one of all possible functions of n or fewer variables.

Each tree row is spanned by a pair of input conductors through which polarized binary signals representing input variables can be applied to device pairs in the respective row. Each basic tree formation requires further processing to construct a finalized DCVS circuit having a selected logic function usage. Circuit interconnections, between input conductors and devices in rows and between devices in successive rows, are predefined in all but two of the tree rows. The finalized logic circuit is constructed by forming variably selectable connections relative to devices and input conductors in those two rows. These connections are formed in a connection region of predetermined size and shape located between the two rows.

Each tree and its device population are so configured that the number of selectable connections needed to form a finalized DCVS logic circuit in a basic tree cluster is small by comparison to the total number of connections making up that circuit. Furthermore, the spacing of devices in at least one of the rows bordering the connection region is tailored to facilitate the formation of selective connections between input conductors and devices in the respective row or rows.

Each tree is "capped" by an output load circuit at which signals representing logical outputs of a respective DCVS logic circuit are generated. Tree rows are numbered in a specific order in inverse relation to their distance from the respective load circuit. Thus, the nth row is nearest to the load circuit and the first row is furthest. When a finalized circuit is constructed, cascode circuit paths are formed through devices in successive rows and the load circuit.

Devices in each row contain source, drain and gate terminations. When operated in a DCVS circuit, the devices conduct precharging and discharging currents between their respective source and drain conductors, in a manner hitherto well known for DCVS circuits; these currents effectively determine the logical output produced at the load circuit, and the power consumed by the respective tree circuit.

In order to provide the logical personalization capability characterized above, each row other than the nth row contains $2^i$ device pairs, where i corresponds to the row number; i.e. the first row contains one device pair, the second row two device pairs, the third row four device pairs, and so on, with the $n-1$st row containing $2^{n-1}$ devices. The nth row contains two device pairs.

In order to optimize the layout of devices in each tree, and impedance characteristics of circuit paths through the devices, device widths are varied in an inverse progression from the first tree row to the $n-1$st tree row, so that the tree cluster effectively fills a rectangular area. Thus, the 2 devices in the first row fill a space about as wide as that taken up by the 4 devices in the second row, which in turn fill a space about as wide as that occupied by the 8 devices in the third row, and so forth. Due to these varied widths, devices in the 1st row present half as much resistance to current flow as devices in the second row, which present half the resistance of devices in the 3rd row, etc. Thus, aggregate resistances of circuits extending through the tree, which determine precharging and discharging/validation delays are less than they would be if devices in all rows were constructed with equal widths.

The connection region of each tree, in which connections are variably formed to establish the logic function personality of the tree, is located between the nth and n−1st rows, and contains a predetermined number of selectable connection points. In the basic (unpersonalized) tree structure, connections relative to all rows other than the nth and n−1st rows are predefined. These include connections between device gates and respective row input conductors, and other connections relative to device source and drain terminations, are predefined in the basic tree structure. The other connections effectively consist of connections between source terminations of devices in the first row and a source of reference potential, and predefined connections between drain terminations of devices in each row and source terminations of devices in the next higher numbered row. Device gates in the n−1st row also have predefined connections relative to input conductors of that row.

Connections relative to devices in the nth and n−1st rows are formed selectively in the connection region. In one embodiment, these connections are simply conductive connections between conductive extensions of drain conductors in the n−1st row and conductive extensions of source conductors in the nth row, and conductive connections between individual input conductors in the nth row and individual device gates in that row which variably establish the polarity of input signals presented to the device pairs in that row. In that embodiment, drain terminations in the nth row have predefined connection relative to source terminations of devices in the respective tree load circuit.

In another embodiment, conductive connections are variably/selectively formed between extensions of drain conductors in the n−1st row and source conductors in the nth row, and between conductive extensions of drain conductors in the nth row and the load circuit. In this embodiment, gate terminations in the nth row have predefined connections to input conductors in that row.

In the foregoing embodiment, a typical 5-row tree contains 17 active device pairs (1 pair in the 1st row, 2 in the second, 4 in the 3rd, 8 in the 4th and 2 in the 5th), and a connection region containing 24 variably selectable points at which conductive connections may be made (16 relative to extensions of drain conductors in the 4th row, and 8 relative to input conductors and device gate terminations in the nth row).

A feature of the invention is that if the logic function to be personalized in a given n-row tree is a function of fewer than n variables, the layout of devices relative to row input conductors is such that devices in circuits not having logical relevance to the tree load output can be effectively isolated by simply cutting selected row input conductors at selected points. When so cut, circuits to one side of the cut do not conduct during precharging and validation operations characteristic of DCVS circuits. Thus, the flow of logically unnecessary currents through the tree can be reduced.

Assume for instance that a function of 3 variables is formed in a 5 row tree. By cutting input conductors in rows associated with the two non-relevant input variables, "don't care" circuits associated with those variables are isolated, eliminating unnecessary charging circuit paths and reducing unnecessary current flow through respective rows, while the remaining unisolated circuits function to provide the correct logical operation.

Processes for designing and manufacturing complex DCVS circuits containing multiple such trees, with defined connections within and between trees, are considerably simpler and less time consuming than processes required for designing and manufacturing functionally equivalent circuits based on prior art device topologies.

In accordance with one embodiment of the invention, conductive connections partially determining the logical function personality of a tree are formed between conductive extensions of drain terminations of devices in the n−1st row and conductive extensions of source terminations of devices in the nth row. The remainder of the logical function personality is established in accordance with one of two species of selective conductive connections relative to elements in the nth row; either between input conductors and device gate terminals in that row, or between device drain terminals in that row and elements of the respective tree output load circuit.

In one species of the invention, the connection region in which the personality-determining connections are made is defined to contain a pair of "dot-OR" personalization conductors. Conductive paths partially establishing the tree logical personality are formed between each of these conductors and drain terminals of selected devices in the 4th row, and also between the same conductors and source conductors of predetermined device pairs in the 5th row.

In one sub-species of the foregoing arrangement, the devices, row input conductors and dot-OR conductors are constructed in different chip planes. Device gates are implicitly defined in the input conductors, at positions at which those conductors cross individual devices. Connections between devices in different rows are formed through contact holes lined with conductive material and conductors extending orthogonal to the row input conductors. Finally, connections establishing "4th-row" logic function personality are formed through conductive vias selectively placed between leads extending orthogonally between contact holes attached to device drains in the 4th row and spaces over which the dot-OR conductors are formed.

In another sub-species, the conductors extending orthogonally from the 4th row to the vias connecting with the dot-OR conductors are made of material having conduction properties subject to alteration. One such material consists of fuse links which can be vaporized by spot application of laser heat. Another material has varied resistivity which is initially high (or equivalent to an "open circuit") and is reduced to a very low condition upon probed application of high electric current to a spot area of the material.

In these "sub-species, logical function personality is established programmably by spot application of laser heat or electric current to selected line elements containing the alternable state material. Such heat or current can be administered by other than the chip manufacturer (e.g. by a circuit designer). Furthermore, the administration of heat or electric current can be performed as part of a programmable process of forming within and between tree clusters, whereby logic functions of individual tree clusters and a chip containing an aggregate of multiple clusters can be programmably established.

In accordance with another species of the invention, electrically active latching and gating devices are formed in the connection region in circuit paths extending between tree elements to be selectively connected. These gating devices are conditioned to act as open and closed switches, in series between connectable tree elements, in accordance with binary states stored in associated latching devices, and the gating devices conditioned as closed switches establish the tree logical function personality.

An interesting aspect of this last-mentioned arrangement is that the connections determining personality are electrically alterable by changing states of the latching devices. Preferably, with this type of arrangement, the latching devices would be connected in tandem as a shift register circuit, and initialized to a selected combination of states by an initial shifting process in which an appropriate pattern of 1 and 0 states is stored in the latches. This alteration can be performed by a user of a chip device containing the arrangement; e.g. to "fine tune" logic function personalities of individual trees.

The foregoing and other embodiments, features, advantages and benefits of the invention may be more fully understood and appreciated by considering the following Description and Claims.

DESCRIPTION OF THE DRAWINGS

FIG. 3 illustrates a typical 5-row device tree in accordance with one embodiment of the invention, wherein a dot personalization bus placed in the connection region between the 4th and 5th rows forms a "platform" or reference for making connections on a selective basis between devices in the 4th and 5th row which partially establish the logical function personality of the tree as a DCVS circuit.

FIG. 4A shows how active gating devices controlled by latching devices are introduced in series circuit between drain terminations of device pairs in the 4th tree row and the dot-OR personalization bus to establish variable conduction paths between device pairs in the 4th and 5th tree rows. FIG. 4B shows how active gating devices controlled by latching devices are introduced in series circuit between input conductors of the 5th row and gate terminations of device pairs in that row, to establish variable circuit paths between the 5th row and the tree load circuit.

FIG. 7 shows how the alteration is performed relative to a tree configured as a function of 4 variables and FIG. 8 shows how it is made relative to a tree configured as a function of 3 variables.

DETAILED DESCRIPTION OF THE INVENTION

Figure 1:
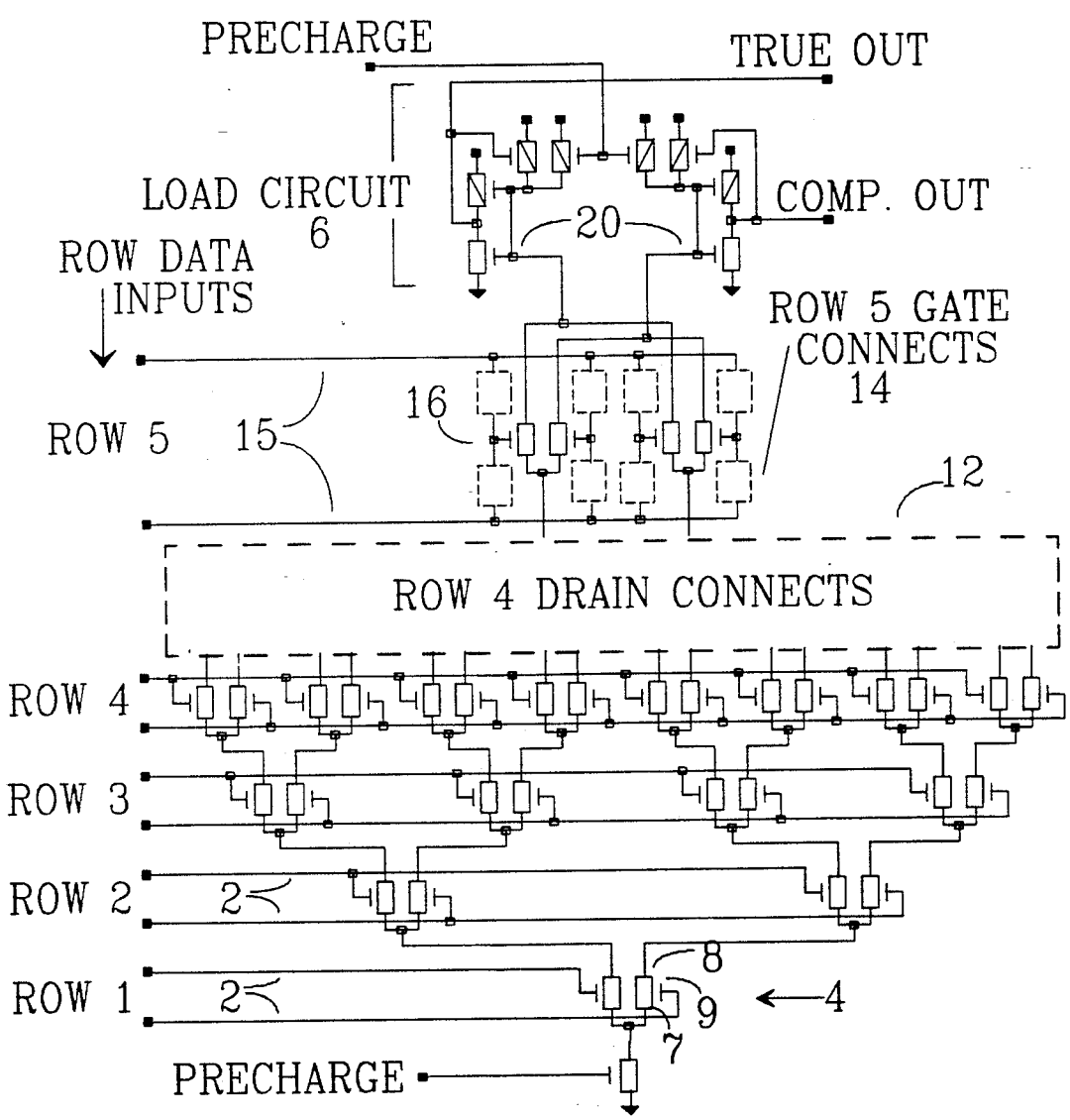
FIG. 1 illustrates a typical 5-row device tree construction in accordance with the present invention.

FIG. 1 illustrates a basic 5-row tree cluster in accordance with the invention. Five rows is chosen here as representative of tree formations with more than 5 rows and less than 5 rows, and also as representative of an arrangement which of itself could be useful in multiple to form circuits providing all desired logic functions on a single chip.

Each row contains a pair of input conductors 2 and one or more pairs of differentially associated active devices 4. The tree is topped by a load circuit shown at 6 and the tree rows are numbered in inverse relation to their distance from the load circuit, or equivalently in direct relation to their distance from the bottom of the tree. Thus, row 5 is closest in position to the load circuit, row 4 is the next closest, and so on.

Each row contains a predetermined number of active device pairs which operate as differentially coupled elements in a finalized circuit. Each of rows 1 through 4 contains $2^{i-1}$ device pairs, where i is the respective row number, and row 5 contains 2 pairs. Thus, row 1 contains one pair of differentially associated devices 4, row 2 contains 2 pairs, row 3 contains 4 pairs, and row 4 contains 8 pairs. In general, the first n−1 rows in an n row tree would contain $2^{i-1}$ device pairs, where i represents the row position relative to the bottom of the tree, and the nth row would contain 2 pairs.

As shown in row 1, and representative of all other tree rows, each device of each pair 4 contains 3 terminals; a source terminal 7, a drain terminal 8 and a gate terminal 9. Voltages at the gate terminals control the flow of charging and discharging currents through respective devices, between source and drain terminals of those devices.

In the illustrated configuration, devices in the tree rows and in the lower half of the load circuit are N type devices, and devices in the upper half of the load circuit (each symbolized by a diagonal line through the rectangle which schematically represents the device) are P type.

Portions of the variable connection region are indicated in dotted outline at 12 and 14. As explained below, with reference to FIGS. 4A and 4B, portion 12 contains orthogonally crossing conductors which are selectively connected to establish selective circuit connections between device pairs in the 4th and 5th row, and portion 14 contains elements for selectively connecting device gates in the 5th row to individual input conductors 15 of that row, so as to selectively determine the polarity of input signals received by the 2 device pairs in the 5th row.

In another embodiment, to be described with reference to FIG. 4C, portion 14 contains conductive elements forming selective circuit connections between device drain terminals in the 5th row and input junctures of the associated load circuit 6, which effectively determine polarities of input functions applied to the load circuit.

With an appropriate finalized configuration of connections relative to the 4th and 5th rows, a circuit is formed which operates to produce output signals, at TRUE and COMPLEMENT (COMPL.) outputs of load circuit 6, having a unique logical relationship to polarized input signals applied to some or all of the row input conductors. It can be shown that in a 5-row tree configured as shown, this logical relationship can be tailored to correspond to any one of all possible functions of 5 or fewer variables.

Relative to logic functions in which fewer than 5 variables have significance, or fewer than all active device pairs in a tree contribute significantly to the load output, expedients are described later which serve effectively to prevent current flow through non-significant circuit paths in the tree and thereby conserve power consumed by the logic circuit represented in that tree.

The circuit formed by connections made in regions 12 and 14 may be viewed as a binary decision tree, in which the output at the apex (load circuit) represents a sum of product terms. Each term is represented by current flowing through a single circuit path running through one device in each tree row. If the input to row 1 is A, signals appearing at drain terminals of devices in that row represent A and its complement A'. If the input to row 2 is B, then the 4 drain outputs in that row correspond to $A \times B, A' \times B, A \times B'$, and $A' \times B'$. Thus, if inputs to the 3rd and 4th rows are C and D, respectively, it follows that the 16 drain outputs in the 4th row will correspond to all 16 possible products of A, B, C and D, and their complements.

As will be shown later, connections formed in region 12 effectively convey logical sums (dot-ORs) of functions represented by selected drain outputs of the 4th row to sources of devices in the 5th row. Thus, various logical sums of products of the 4 variables A, B, C, D and their complements can be so conveyed to the device sources in the 5th row, and logically multiplied in each device by the true or complement of the input variable applied to that row, which depends upon the connections set up in region 14. It can be appreciated therefore that by appropriate selection of connections in regions 12 and 14 the signal conveyed to the load circuit outputs can be made to correspond to any possible sum of products of the 5 variables represented by the inputs to the 5 tree rows.

A DCVS circuit formed in a tree structure like that shown in FIG. 1 operates as follows.

PRECHARGE inputs, at the tree load circuit and the device below row 1 in the tree, are connected to a not-shown clock pulse signal source located elsewhere on the chip that contains the respective tree circuit. This signal varies between inactive (positive) and active (ground) voltage levels. As the clock signal goes to ground, the N polarity device at the bottom of the tree is rendered non-conductive, interrupting the flow of current between the ground reference and the devices in rows 1 through 5.

At the same time, the P polarity devices in the upper portion of the load circuit are rendered conductive, allowing current to flow through load circuit junctures 20 and build up positive charges at those junctures. This causes the TRUE and COMPLEMENT ("Comp.") outputs of the load circuit to go to a low voltage state. The low potentials at the load circuit outputs are fed back regeneratively through paired devices in that circuit to effectively latch the load circuit in this state until "validation" occurs.

Validation occurs when the PRECHARGE signal returns to its quiescent positive state. At that time, the variable differential signals applied to the 5 row inputs cause one device in each pair in each row to conduct, so that conductive paths formed in series through the tree rows allow positive charge accrued at one of the load junctures 20 to discharge to ground through the tree rows. This causes a respective TRUE or COMPLEMENT load circuit output to rise as an indication of a logical result function. The output which rises depends upon instantaneous states of the 5 row inputs and circuit connections made in connection regions 12 and 14.

A more detailed explanation of the foregoing precharge and validation operations, relative to earlier forms of DCVS circuits, is found in U.S. Pat. No. 4,570,084 to Griffin et al.

Figure 2:
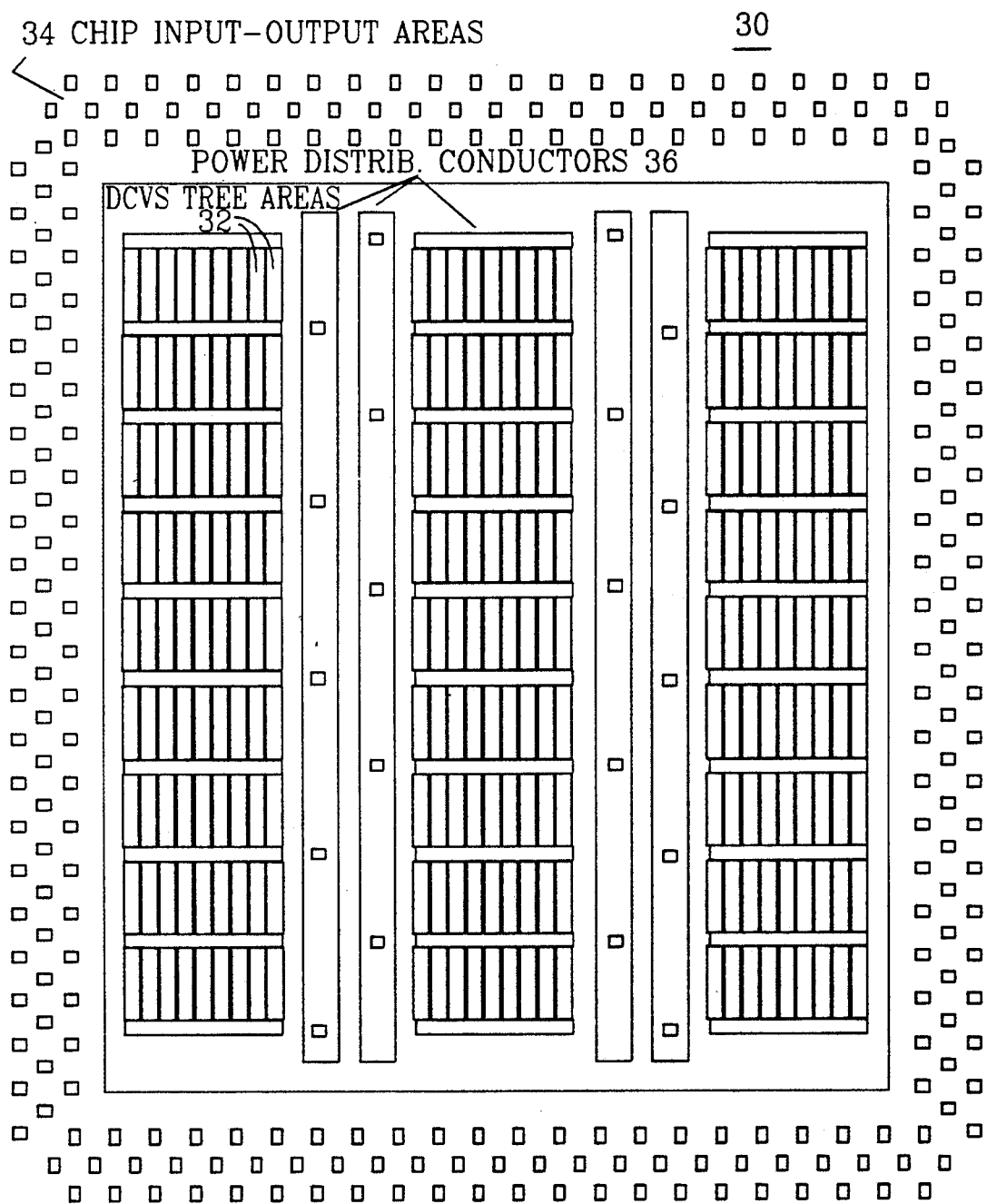
FIG. 2 illustrates the general topology of a chip containing multiple device trees formed in accordance with the invention.

FIG. 2 provides an overview of a semiconductor chip 30 containing areas 32 in which multiple trees of the type shown in FIG. 1 can be formed. Input/output pins for all of the chip circuits are shown at 34, and power distribution conductors for supplying DC voltages to the chip circuits are shown at 36. It should be understood that this is merely illustrative, and that it is feasible to allocate different areas of such chips for both DCVS tree circuits and other forms of logic circuits. Also, it should be understood that it is feasible to place tree constructs with different numbers of input rows in pre-allocated chip spaces such as 32.

FIG. 3 shows an embodiment of the 5-row tree structure characterized in FIG. 1, wherein the portion 12 of the connection region contains a pair of conductors 40 labelled "personality dot bus". Conductors 40 form a base for making connections between device drain terminals in the 4th (n−1st) row of the tree and device source terminals in the 5th (nth) row of the tree. Connections made to the conductors 40 include predefined and selectively (variably) defined connections. Predefined connections extend from conductors 40 to source terminals 41 of devices in the 5th row. Selectively defined connections, which partially determine the tree logical personality, are formed between conductors 40 and drain terminals 42 of devices in the 4th row. A process and topological construction for forming such connections is described later with reference to FIGS. 5 and 9A through 9F.

In the tree structure of FIG. 3, portions 14 of the connection region extend between device pairs in the 5th row and input conductors in that row. In these portions, connections are made in a selective order between the input conductors and gate terminals of individual device pairs so that the 5th row input to each device pair is applied with a selectively determined polarity.

Since FIGS. 1 and 3 are schematic illustrations, it will be understood that although the row input conductors in FIG. 1 appear schematically as not crossing over devices in the same row, in reality they may (and preferably will) cross as suggested in FIG. 3. More of this later in the discussions of FIGS. 5 and 9A through 9F.

Figure 4A:
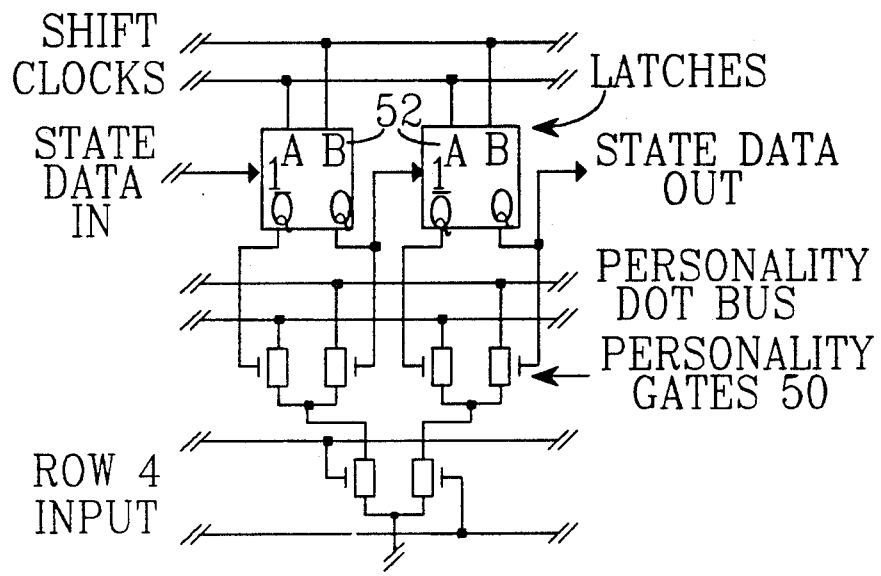
FIGS. 4A and 4B illustrate how electronically alterable connections are made in the connection region shown in FIG. 3 in accordance with one embodiment of the invention.
Figure 4B:
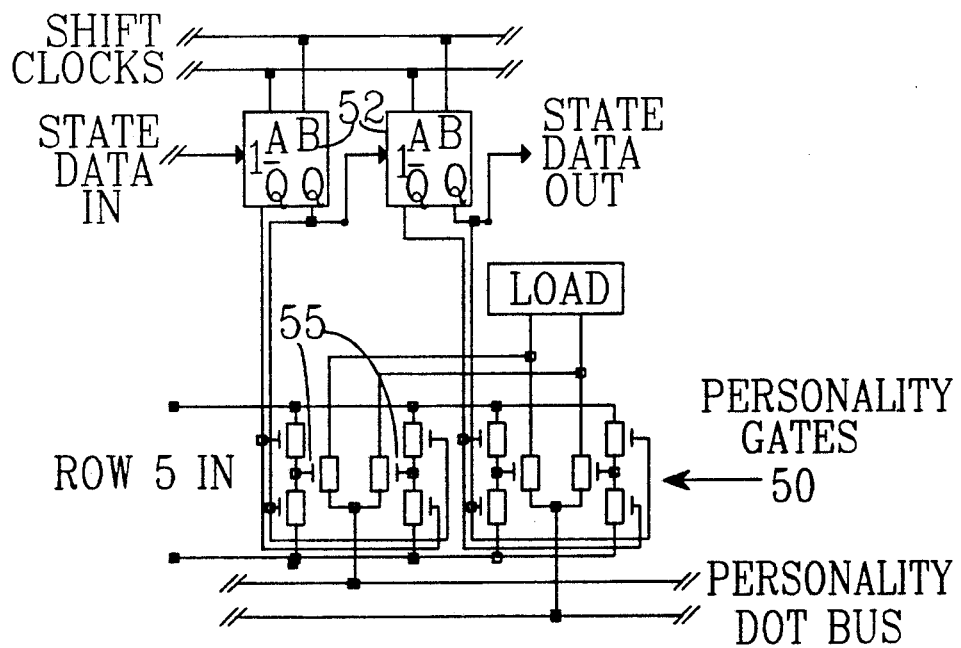

Up to this point, connections establishing the circuit personality of the tree structure have been shown as permanently formed conductive entitles, which are not alterable after they are constructed. FIGS. 4A and 4B illustrate how such connections can be made in a form which can be altered electrically. Thus, a user of devices containing trees with such alterable personality would be able to vary the logical personalities of individual tree circuits in order to "fine tune" logical functions assigned to the circuits.

In another embodiment of the invention, discussed later relative to FIGS. 10 and 11, materials having alterable physical properties (e.g. materials acting as fuses) are placed in series in conduction paths through the connection region, and personality connections are made on a programmable (but permanent) basis by spot application of energy (e.g. laser heat) to such materials.

FIG. 4A shows how electrically alterable personality connections are formed, between device drains in the 4th row and dot-OR leads 40, to effectively establish alterable circuit connections between devices in the 4th and 5th rows of the respective tree. For this purpose, personality gating devices 50 are placed in series circuit between each device drain in the 4th row and each conductor 40 to form functional equivalents of "switch contacts" between respective drain terminals and the conductors 40. In this configuration, latch circuits 52 are provided in each tree for controlling conductivity states of pairs of gate devices 50 so as to variably establish paths of conduction between individual device drains in the 4th tree row and device sources in the 5th row through the conductors 40.

Preferably, the latch circuits 52 in all trees on a chip are connected as a shift register, so that by a simple shifting process all latches can be initialized to an arbitrary configuration of binary states determinable by a user of a system containing the chip. Thus, switch paths formed by respective gate devices 50 could be automatically initialized to a desired configuration of open and closed states, determining 4th to 5th row logic personalities in respective individual tree circuits, and then left in (or repeatedly initialized to) that configuration of states until the chip user decides to establish a new or revised configuration.

FIG. 4B shows functional counterparts of the personality gates 50 and associated latches 52 of FIG. 4A relative to connection regions 14; i.e. relative to connection paths between 5th row input leads and 5th row device gate terminals. Here, gates 50 provide alterable connection paths from each device gate to one or the other of the 5th row input leads, in accordance with instantaneous states of associated latches 52. The latches 52 are preferably linked to all other latches 52 for serial shifting as noted earlier. Thus, depending upon initialized states of latches 52, gate terminals such as 55 in each differentially coupled device pair of row 5 are coupled with selective polarity to the 5th row input leads.

Figure 4C:
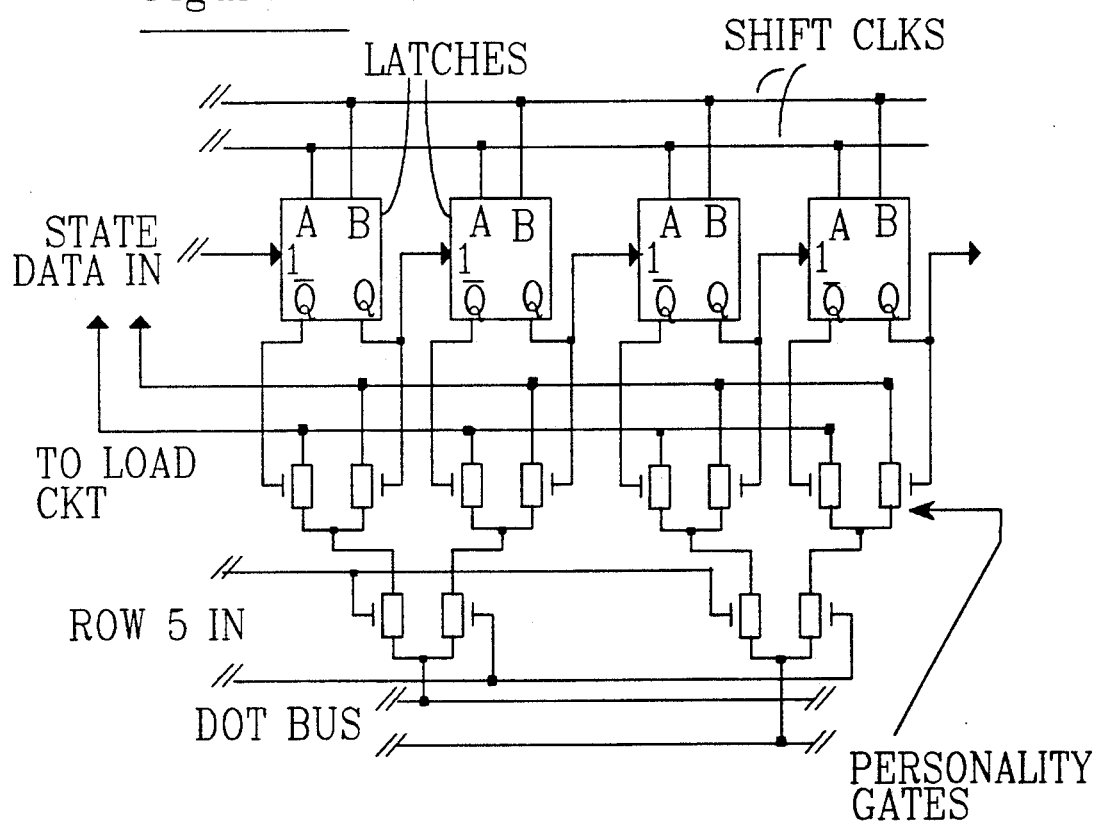
FIG. 4C illustrates a variation of the electrically alterable arrangement shown in FIG. 4B, wherein gating devices in series between drain terminations of device pairs in the 5th row and the tree load circuit establish varied configurations of circuit paths between the 5th row and the load circuit.

FIG. 4C illustrates a variation of the connection regions 14, in which those regions are situated between device drain terminals in the 5th row and device source terminals in the tree load circuit (rather than between 5th row input conductors and 5th row device gates). Also shown in this figure is an arrangement of gates and latches corresponding to those shown in FIG. 4B for establishing electrically alterable personality connections in this configuration of the regions 14.

Figure 5:
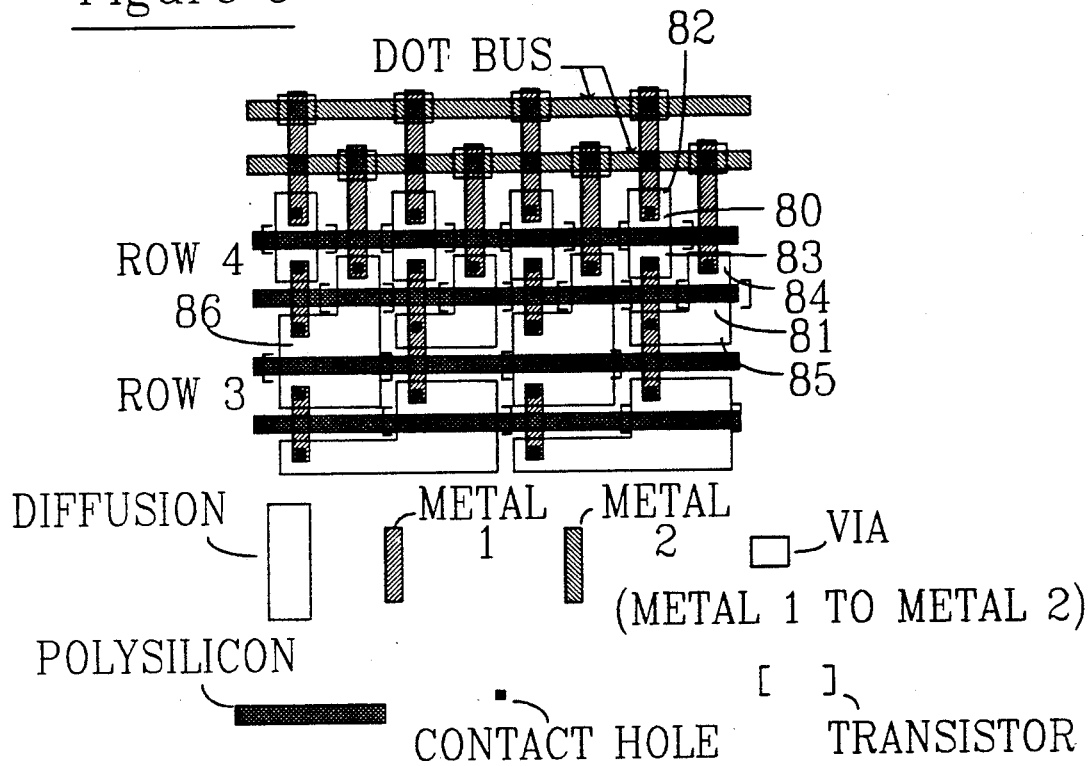
FIG. 5 illustrates a topological detail of a portion of a 5-row tree in accordance with FIG. 3, wherein permanent connections are formed in the connection region by selective application of materials, and wherein device widths are varied in an inverse progression from the 1st through the 4th tree rows.
Figure 6:
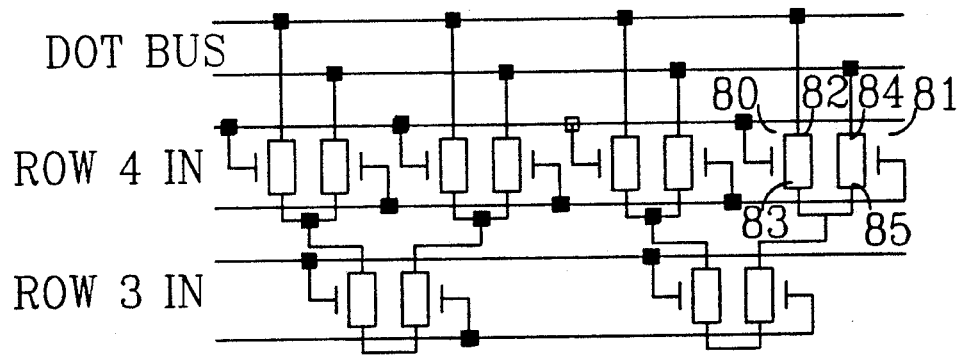
FIG. 6 illustrates the detail of FIG. 5 in a schematic form.

FIGS. 5 and 6 provide comparative topological and schematic views of a detail of a preferred construction of a tree circuit with unalterable personality connections of the type shown in FIG. 3. Each view includes identical portions of the third and fourth rows and the dot bus described earlier. In the topological view it is seen that the tree elements are constructed in layers. The processing of individual layers is indicated in FIGS. 9A through 9F.

Figure 9A:
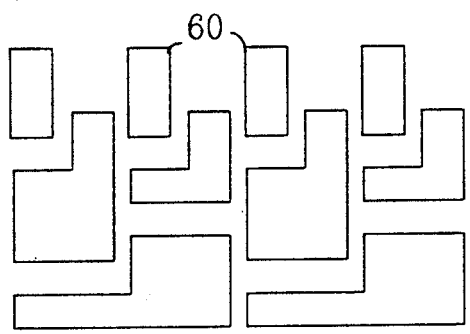
FIGS. 9A thru 9F illustrate a process for forming the structure shown in FIG. 5.
Figure 9D:
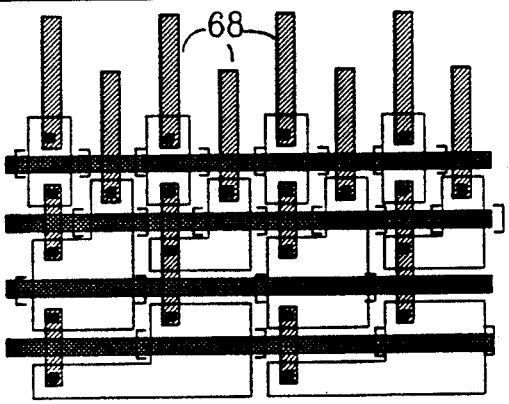
Figure 9B:
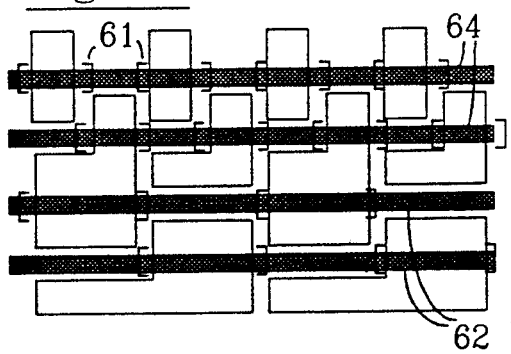

Referring to FIGS. 5 and 9A through 9F, areas 60 formed in a diffusion layer (FIG. 9A) represent bodies of what will become active device elements/transistors in the 3rd and 4th rows of the tree assembly. The plane containing the diffusion elements/areas is covered with a dielectric layer and conductive polysilicon lines 62, 64, respectively representing the 3rd and 4th row input conductors, are deposited (FIG. 9B). Where each conductor overlies a diffusion element, the capacitive coupling between that conductor and element forms a gate terminal relative to the device respectively associated with that element; i.e. the gate terminals of the devices in the first 4 tree rows, as shown schematically in previous figures are not discrete conductive entities separate from respective row conductors to which they connect.

Another dielectric coating (not-shown) is applied over the polysilicon lines, and contact holes 66 are formed in the two dielectric layers now overlying the devices (FIG. 9C) to establish contact points for forming connections between drain ends of devices in the third row and source ends of devices in the 4th row and for extending connections from device drains in the 4th row to as yet unformed leads representing the dot-OR bus. Then, conductors 68 (metal 1) are deposited over and orthogonal to the input conductors (FIG. 9D), filling the contact holes 66, and extending electrical contacts from the latter. Some of the elements 68 thereby form connections, through contact holes 66, between drain ends of devices in the 3rd row and source ends of devices in the 4th row. Other elements 68 form conductive paths extending from drain ends of devices in the 4th row into the connection region 12 previously discussed.

Next, the existing arrangement is covered with an additional dielectric layer (not-shown), and conductive vias 70 are formed at end points of the elements 68 which extend into the connection region 12 (FIG. 9E), to project conductive contacts from those end points through the last-applied dielectric coating. Finally, a pair of conductors 72 is deposited orthogonal to the metal 1 elements (FIG. 9F), forming the leads of the dot-OR bus which connect through the selectively placed vias and elements 68 to selected device drains in the 4th row.

Figure 9E:
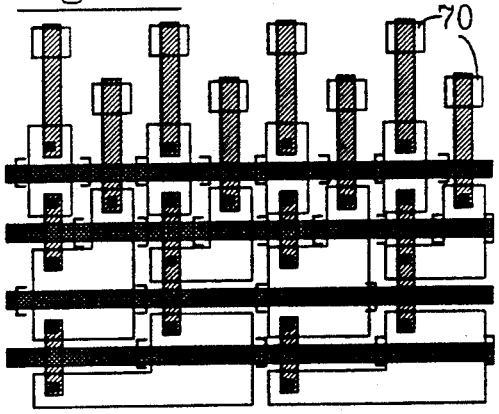
Figure 9C:
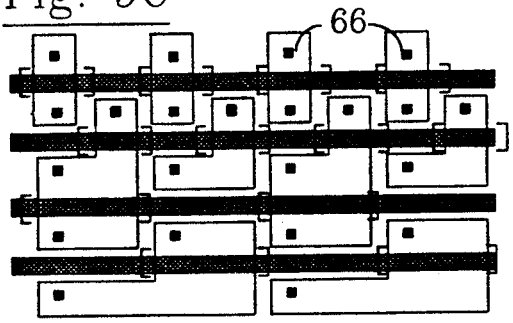
Figure 9F:
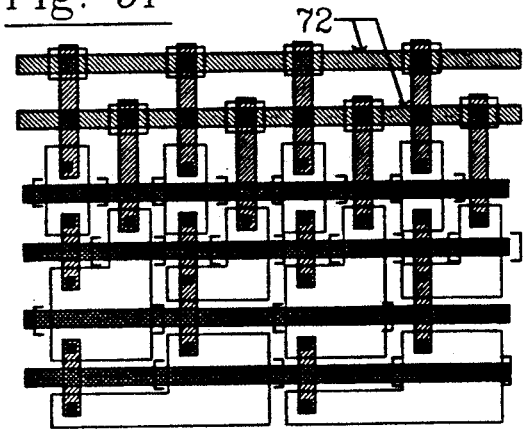

Although not seen in these views, it should be understood that the connections between the lines in the dot-OR bus and the source terminals in the 5th row are formed during process steps represented in FIGS. 9D and 9E; with metal 1 extensions similar to extensions 68 formed between contact holes contacting 5th row sources and points to be intersected by predetermined ones of the dot-OR leads, and vias extended from ends of such elements to contact the subsequently formed dot-OR leads.

It should be noted that paired devices in each row are staggered in position relative to the respective input conductors. Thus, devices such as 80 and 81 (FIG. 5), forming a differentially associated pair in the 4th row, are positionally offset so that each is crossed by only one of the input conductors in that row; i.e. the one which is effectively gate-coupled to the underlying device.

From this, it should be understood that the variable gate connections suggested in FIG. 4C, between 5th row input leads and devices in that row, requires a variation of the procedure shown in FIGS. 9A through 9F, so that the gate couplings from 5th row input conductors to 5th row devices are formed selectively in the manner indicated in FIG. 4C. For this purpose, the diffusions which represent the devices in the 5th row can be laid out to have the requisite gate couplings to individual 5th row input leads to provide a desired personality function effect. Alternatively, the 5th row input conductors can be deposited so as not to directly overlie the 5th row devices and they can be gate-coupled to selected devices in each pair by extended conductive elements overlying these devices.

Also, it should be noted in FIGS. 5 and 9 that devices in the 3rd row are about twice as wide as those in the 4th row. If this view were extended to devices in the 1st and 2nd rows, it would be seen that this is indicative of a desired inverse progression of device widths, in successive rows from the 1st through the 4th rows; devices in the 1st row being wider than those in the 2nd row, devices in the 2nd row being wider than those in the 3rd row, and devices in the 3rd row being wider than those in the 4th row. The reason for this is that the number of devices in each row increases progressively from the 1st to the 4th row (2 in the 1st, 4 in the 2nd, 8 in the 3rd and 16 in the 4th), and in order to minimize precharge and validation discharge delays through the circuit paths extending through these devices it is desirable to minimize resistances presented by individual devices in such paths without negative effect on device packaging density. Thus, by decreasing device widths progressively from the 1st row to the 4th row, devices forming that part of the tree essentially fill a small rectangular area allocated for the tree (see areas 32, FIG. 2), with the width of that area just large enough to accommodate the row with the most devices (the 4th row) and with the devices in the rows having fewer devices made wider so as to present reduced resistance per device and thereby minimize charging and discharging delays. Appropriately, devices in each of the first 3 rows would be made twice as wide as devices in the next higher numbered row to make optimal use of available space and minimize circuit delays.

Referring again to FIG. 5, areas representing drain and source terminals of device 80 are respectively indicated at 82 and 83. Corresponding areas of paired device 81 are respectively indicated at 84 and 85. In some instances two devices share a common diffusion space, as shown at 86 (where a single diffusion element forms devices in rows 3 and 4. As noted earlier, gate terminals of the devices are portions of the respective row conductor which directly overlie the devices.

Figure 7:
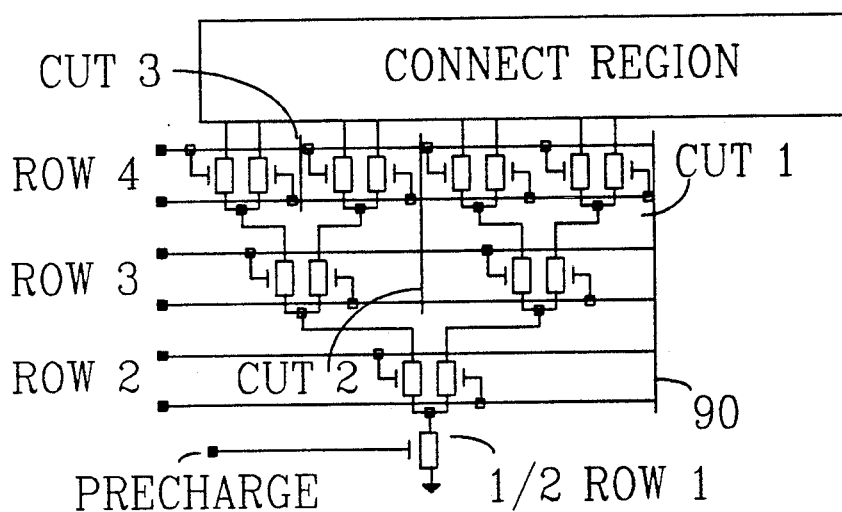
FIGS. 7 and 8 provide schematic illustrations of how the 5-row tree construction of FIG. 3 may be altered when the logical function to be configured depends on fewer than 5 variables. In these embodiments, input conductors to tree rows are selectively cut so as to effectively deactivate half of the device pairs in one or more rows.
Figure 8:
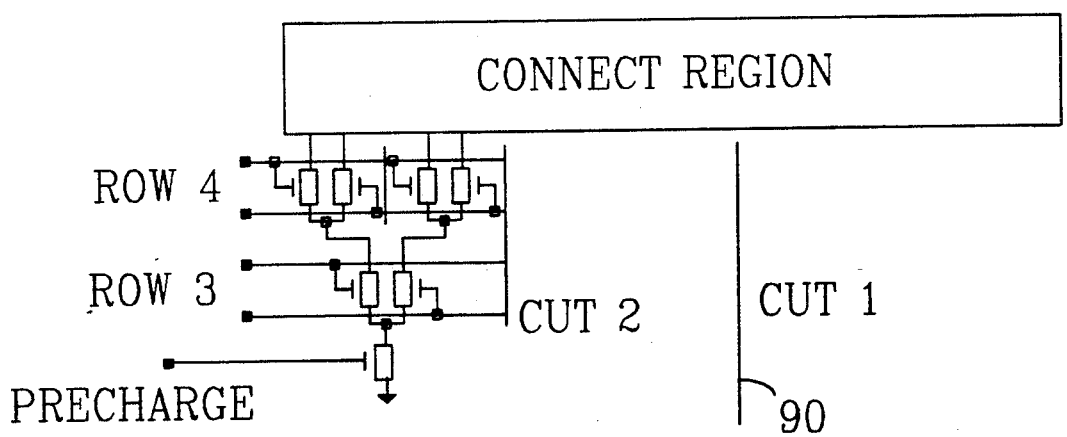

FIGS. 7 and 8 illustrate how circuits made out of the 5-row tree structures described so far, which represent functions of fewer than 5 variables, can be configured to operate more efficiently. Assuming that input signals are applied to the row input conductors from a point to the left of the tree devices in each row, it can be appreciated that a cut such as 90 in any conductor, would effectively isolate devices to the right of the cut from respective inputs. This would preventing flow of discharge currents through those devices during the previously mentioned validation operations.

FIG. 7 shows a cut isolating half of the devices in each of the first 3 rows, and effectively eliminating the input variable represented by the input to row 1. As shown in this figure, if the device receiving the precharge input signal (the device below row 1 in FIGS. 1 and 3) has its drain connected directly to sources of devices in the 2nd row to the left of the cut, all devices to the right of the cut will neither charge nor discharge during operation of the circuit. Thus, although devices thus isolated occupy chip space, they do not affect the power consumed by the chip.

FIG. 8 shows that if the cut is made further to the left, devices in both the first and second rows are effectively isolated. A circuit of this type could be formed to represent a function of 3 variables, and provide efficient charge/discharge operation as described above.

Figure 10:
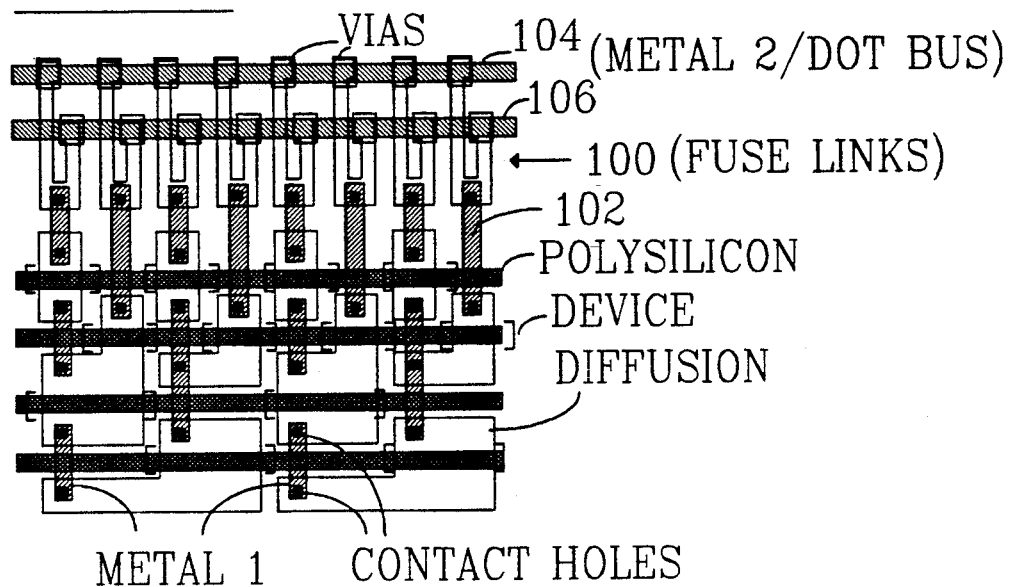
FIGS. 10 and 11 provide comparative topological and schematic views of a portion of a tree cluster in which conduction paths through the connection region contain fuse links that can be selectively vaporized, by spot application of laser heat, to leave remaining conduction paths determining the logic personality of the tree.
Figure 11:
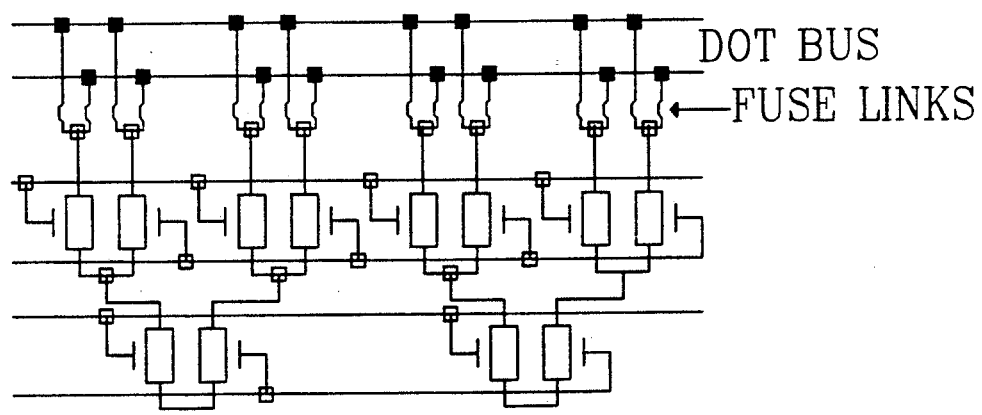

FIGS. 10 and 11 provide comparative topological and schematic views of a part of a DCVS tree structure in which circuit paths through the connection regions contain small areas 100 of materials having physically alterable properties that permit formation of logic personality by programmed modification of material properties at selected areas.

In the example shown in these Figures, the materials are "fuse links" conductively connecting between extensions 102 (metal 1) from device drain terminals in the 4th row and dot bus lines 104 and 106 (metal 2). Fuse links are severable/removable by selective (spot) application of heat (e.g. focussed laser energy). Points to which heat is applied can easily be designated by programs. What remains after designated links have been removed is a network of connections representing desired logic personalization between 4th row device drains and the dot bus. Equivalent links (not shown) would be provided between 5th row device gates and input conductors (or 5th row drains and load circuit sources), and processed by heat application to complete the logic personalization of the tree.

Use of such fuse links in LSI semiconductor circuit arrays, to provide for programmable formation of array logical personality is generally well known in the art; refer for instance to "A 16K CMOS PROM With Polysilicon Fusible Links", by L. Metzger, IEEE Journal of Solid-State Circuits, Vol. SC-18, No. 5, October 1983, pages 562–567). It is believed, however, that applicability of such materials in circuit arrays associated with DCVS logic has not hitherto been known or considered, and in fact would not be feasible were it not for the basic connection tree structure presently disclosed. Thus, use of such fuse links as shown is considered an aspect of the present invention.

As noted above, fuse links are only one form of physically (and permanently) alterable material which could be used to establish personality in DCVS trees of the present invention. Another form of alterable material having resistance properties which can be modified (from initially high resistivity to low resistivity) by probed application of high electric currents to establish connection paths between circuits that are isolated before the modification, is disclosed in "A Redundancy Circuit For A Fault-tolerant 256K MOS RAM", T. Mano et al, IEEE Jour. of Solid-State Circuits, Vol. SC-17, No. 4, August 1982, Pages 726–731.

To use elements of this type, having modifiable resistivity, in the connection regions of present circuits would require added probing circuitry to permit application of the necessary electric currents to individual elements.

Another factor to note, in respect to using modifiable fuse links or variable resistivity elements, is that since the modifications are conducted at discrete physical locations they are easily programmable for automated implementation. Furthermore, it would be relatively simple to provide networks of conductors and modifiable elements between tree clusters of the type presently disclosed so that modifiable elements in tree clusters and between tree clusters could be modified in one discrete process (e.g. to selectively establish logical personality of tree clusters and input-output signal interconnections between clusters at the same time).

The foregoing and other features, aspects and advantages of the invention are now claimed as follows:

We claim:

1. An integrated circuit array suitable for forming multipurpose differential cascode voltage switch (DCVS) circuits comprising:
    a plurality of semiconductor device pairs arranged in ordered rows; each row containing a predetermined number of device pairs associated with the row order;
    a pair of input signal conductors spanning each row; and
    a connection space between two of the rows dedicated for forming selective connections between devices in those two rows which establish a predetermined logical relation between input signals applied to said input signal conductors and output signals produced by said array, said logical relation being one of a plurality of different logical relations.

2. An integrated circuit array useful for constructing any of a plurality of logically distinct Differential Cascode Voltage Switch (DCVS) circuits comprising:
    a load circuit having input and output terminals;
    an array of n rows of differentially associated semiconductor device pairs (n being at least 2); said rows numbered in inverse ordered relation to their positions relative to said load circuit, so that the nth row is the row closest in position to the load circuit and the 1st row is the row furthest from the load circuit; each row containing a predetermined number of device pairs related to the respective row number; each device of each pair having source, drain and gate terminals so related that input signals applied to the gate terminal of a device determine conduction of signal currents through the device which in turn determine output signals produced by the respective device relative to other devices in said array and said load circuit; drain terminals of devices in the nth row having output conductive connections relative to input terminals of said load circuit;
    means coupling device drains in said nth row to said load circuit;
    n pairs of input signal conductors spanning respective said rows of devices; said conductors having predefined connections relative to device gate terminals in respective rows in all but the nth said row;
    device drains in each row other than the nth and n−1st row having predefined connections relative to device sources in the next higher numbered row;
    a dedicated connection area located between the nth and n−1st said rows for forming variably definable connections between drain terminals in the n−1st row and source terminals in the nth row, such that by selectively defining connections in said area the logical output of the respective tree load circuit, relative to logical input signals applied to said row input conductors, is determinable to conform to any one of all possible logic functions of n variables.

3. A circuit array in accordance with claim 2 for forming DCVS circuits with variably definable logic functions, wherein said dedicated connection area extends between pairs of differentially associated devices in the nth said row and allows for forming selective connections between the input conductors of that row and device gates in that row, affecting the logic function personality of the array.

4. An array in accordance with claim 2 wherein said dedicated connection area extends between the nth row and said load circuit, and allows for forming selective connections between device drains in the nth row and said load circuit which affect the logic personality of the array.

5. An array in accordance with claim 2 wherein the nth said row contains 2 device pairs and each row other than the nth row contains $2^{i-1}$ device pairs, where i corresponds to the row number.

6. An array in accordance with claim 5 wherein the value of n is between 2 and 5.

7. An array in accordance with claim 5 wherein portions of said dedicated connection area are modifiable at predetermined points in said area to form connections between drain terminals of devices in the n−1st row and source terminals of devices in the nth row which determine at least in part the logic function personality of the respective tree.

8. An array in accordance with claim 7 wherein said dedicated connection area contains a pair of dot-OR conductive lines for forming selective dot-OR logic connections relative to drain terminals of devices in the n−1st row, and conveying associated dot-OR signals relative to predetermined source terminals in the nth row; whereby the logic function personality of the tree is determinable at least in part by the dot-OR connections formed relative to said dot-OR lines.

9. An array in accordance with claim 7 wherein said dedicated connection area contains:
    active gate devices coupling in series between device drain terminals in said n−1st row and said dot-OR lines, and between device gate terminals in said nth row and individual input conductors in that row;
    a latch device coupled to each gate device for determining the conductivity state of the respective gate device in accordance with a binary state stored in the respective latch;
    whereby a logic function personality established by a given state of said latch and gate devices is electrically alterable by modifying binary states stored in said latch devices.

10. An array in accordance with claim 2 wherein:
    devices in the 1st through the n−1st said rows have progressively decreasing widths from row to row;
    whereby devices in said rows present differing resistances to current flow and therefore charging and discharging delays, in circuits extending through devices in said rows, are less than they would be if devices in all rows were made with the same width.

11. An array in accordance with claim 2 wherein:
    Devices in said rows are arranged so that if input conductors spanning a row are cut devices to one side of the cut become isolated from signals carried by the input conductors and do not conduct charging and discharging currents during DCVS circuit operations of the respective array;

whereby when the array is logically personalized to implement a DCVS circuit whose operation represents a function of fewer than n variables, devices whose operation is not significant to the final output of the array load circuit can be blocked from conducting so as to improve the efficiency of operation of the respective DCVS circuit.

12. An array in accordance with claim 2 wherein said dedicated connection region contains passive devices having alterable conduction properties;

whereby the array can be processed programmably to have a selected DCVS logic circuit personality by altering conduction properties of selected said passive devices.

13. An array in accordance with claim 12 wherein said passive devices are fuse links which can be vaporized by spot application of laser heat energy.

14. An array in accordance with claim 12 wherein said passive devices are polysilicon elements having high resistivity prior to modification, which elements can be modified by application of electric currents with predetermined intensity to individual elements.

15. An array in accordance with claim 2 wherein said device gates consist of portions of respective row input conductors which abut respective devices and couple capacitively to respective devices by virtue of such abutment.

16. An array in accordance with claim 12, wherein said passive devices are identical to passive devices located between arrays, whereby programmable processing of said passive devices within said array can be carried out conjointly with programmable processing of passive devices between said array and other arrays, so that the logical personality of said array and its interconnections with other arrays can be conjointly established in one programmed operation.

* * * * *